(12) United States Patent
Berger et al.

(10) Patent No.: US 6,424,972 B1
(45) Date of Patent: Jul. 23, 2002

(54) FLOATING POINT CONVERSION FOR RECORDS OF MULTIDIMENSIONAL DATABASE

(75) Inventors: Alexander Berger, Redmond; Amir Netz, Bellevue; Cristian Petculescu, Redmond, all of WA (US)

(73) Assignee: Microsoft Corporation, Redmond, WA (US)

( * ) Notice: Subject to any disclaimer, the term of this patent is extended or adjusted under 35 U.S.C. 154(b) by 182 days.

(21) Appl. No.: 09/602,610

(22) Filed: Jun. 22, 2000

Related U.S. Application Data

(60) Provisional application No. 60/140,432, filed on Jun. 22, 1999.

(51) Int. Cl.$^7$ ............................................. G06F 17/30
(52) U.S. Cl. ............................ 707/101; 707/3; 707/102
(58) Field of Search ........................... 707/3, 101, 102, 707/103

(56) References Cited

U.S. PATENT DOCUMENTS

| | | | | |
|---|---|---|---|---|
| 5,794,229 A | * | 8/1998 | French et al. .................... | 707/2 |
| 5,799,300 A | * | 8/1998 | Agrawal et al. ................ | 707/5 |
| 5,832,475 A | * | 11/1998 | Agrawal et al. ................ | 707/2 |
| 5,890,151 A | * | 3/1999 | Agrawal et al. ................ | 707/5 |
| 5,918,232 A | * | 6/1999 | Pouschine et al. ........... | 707/103 |
| 5,926,820 A | * | 7/1999 | Agrawal et al. ............. | 707/200 |
| 6,003,036 A | * | 12/1999 | Martin ........................ | 707/102 |
| 6,094,651 A | * | 7/2000 | Agrawal et al. ................ | 707/5 |
| 6,122,628 A | * | 9/2000 | Castelli et al. .................. | 707/5 |
| 6,167,396 A | * | 12/2000 | Lokken .......................... | 707/3 |
| 6,182,061 B1 | * | 1/2001 | Matsuzawa et al. ............ | 707/2 |
| 6,205,447 B1 | * | 3/2001 | Malloy ........................ | 707/102 |
| 6,301,579 B1 | * | 10/2001 | Becker ........................ | 707/102 |

* cited by examiner

*Primary Examiner*—Charles L. Rones
(74) *Attorney, Agent, or Firm*—Merchant & Gould P.C.; John W. Branch

(57) ABSTRACT

A method and system for compressing and decompressing read only data in records that have a fixed size. A plurality of records are divided into segments having a predetermined size. For each segment, the records are arranged in a table with rows for each record and a column for each field in each record. The width of each column of repeated data is compressed to zero bits and the repeated data is referenced in a header of the segment. The width of each column of integer data is compressed to the minimum number of bits required to represent the largest integer value in the fields of the column. Floating point data in each column is converted to integer data and the width of the each column with converted integer data is set to the minimum width necessary to represent the largest converted integer in each column. The conversion to integer data is calculated for floating point and real numbers with a minimum precision exponent that is stored in the header for the segment. Floating point data is cleaned when it is converted to integer data. The information in the header is employed to decompress the compressed records in the segment. The decompression lends itself well to fast random access of secondary storage devices.

20 Claims, 9 Drawing Sheets

600

| IDENTIFIER | QUANTITY | PRICE | STORE | STATE | |
|---|---|---|---|---|---|
| 4 BYTES | 4 BYTES | 4 BYTES | 2 BYTES | 1 BYTE | |
| 919 | 1 | 3.5 | 54 | 1 | RECORD 1 |
| 999 | 2 | 7.55 | 54 | 1 | RECORD 2 |
| \| | \| | \| | " | " | RECORD N-1 |
| 979 | 10 | 2.0 | 54 | 1 | RECORD N |

15 BYTES = 120 BITS FOR EACH RECORD

Fig. 6

| IDENTIFIER | QUANTITY | PRICE | STORE | STATE | |
|---|---|---|---|---|---|
| 10 BITS | 4 BITS | 10 BITS | 0 BITS | 0 BITS | |
| | | | | | RECORD 1 |
| | | | | | RECORD 2 |
| \| | \| | \| | \| | \| | RECORD N-1 |
| | | | | | RECORD N |

24 BITS = 3 BYTES FOR EACH RECORD

$$L = V \times 10^n + (Vsign) \times .5 \qquad \text{EQUATION 1}$$

$$V = L/10^n \qquad \text{EQUATION 2}$$

Fig. 8

COMPRESSION

FLOATING POINT CONVERSION FOR RECORDS OF MULTIDIMENSIONAL DATABASE

RELATED APPLICATIONS

This application claims the benefit under 35 U.S.C. § 119 (e) of U.S. Provisional Application, Ser. No. 60/140,432 filed on Jun. 22, 1999.

FIELD OF THE INVENTION

The present invention pertains generally to computer-implemented databases, and more particularly to compressing records in such databases.

BACKGROUND OF THE INVENTION

Online analytical processing (OLAP) is an integral part of most data warehouse and business analysis systems. Compared with online transaction processing (OLTP), OLAP services provide for fast analysis of multidimensional information. For this purpose, OLAP services provide for multidimensional access and navigation of the data in an intuitive and natural way, providing a global view of data that can be "drilled down" into particular data of interest. Speed and response time are important attributes of OLAP services that allow users to browse and analyze data online in an efficient manner. Further, OLAP services typically provide analytical tools to rank, aggregate, and calculate lead and lag indicators for the data under analysis.

In OLAP, information is viewed conceptually as cubes, consisting of dimensions, levels, and measures. In this context, a dimension is a structural attribute of a cube that is a list of members of a similar type in the user's perception of the data. Typically, there are hierarchy levels associated with each dimension. For example, a time dimension may have hierarchical levels consisting of days, weeks, months, and years, while a geography dimension may have levels of cities, states/provinces, and countries. Dimension members act as indices for identifying a particular cell or range of cells within a multidimensional array. Each cell contains a value, also referred to as a measure, or measurement.

One issue regarding the design of multidimensional databases is how to store the cell information in the multidimensional space. One potential design choice is to represent the multidimensional space as an array of cells, with the size of the array determined by the multiplication of the number of points in each dimension. A significant problem with this approach is that the size of the database grows exponentially as the number and size of the dimensions increase. This leads to a rapid depletion of the physical resources such as persistent storage and RAM required to implement the database. This phenomenon is known as data explosion for multidimensional databases.

Additionally, space is wasted in the above-mentioned approach, as data in multidimensional databases tends to be sparse. That is, not every cell is expected to have a value or measure associated with it. For example, consider a Store dimension having a hierarchy of Country, State, and City specifying the location of a store, and a Product dimension having a product identification and a product count measure. No store in the database will be expected to stock every possible product, and in fact any one store may only stock a small percentage of the available products. In this situation, most of the cells in the multidimensional space would contain no data, thus wasting much of the space allocated to the database.

Also, almost every cell in a particular column of a multidimensional space may contain exactly the same value. For example, the cell in each record indicating the "Country" field for each store might always contain the same value representing the United States of America. In this case, all of the cells in this column of a multidimensional space could be represented by a single value instead of wasting an entire column of cells in the multidimensional space.

Another issue relates to the capability to perform aggregations on the multidimensional data. Databases are commonly queried for aggregations (e.g. summaries, minimums, maximums, counts, etc.) of detail data rather than individual data items. For example, a user might want to know sales data for a given period of time without regard to geographical distinctions. These types of queries are efficiently answered through aggregations. Aggregations are precomputed summaries of selected detail data that allow an OLAP system or a relational database to respond quickly to queries by avoiding collecting and aggregating detailed data during query execution. Without aggregations, the system needs to scan all of the rows containing the detailed data to answer these queries, resulting in potentially substantial processing delays. With aggregations, the system computes and materializes aggregations ahead of time so that when the query is submitted to the system, the appropriate summary already exists and can be sent to the user much more quickly. Calculating these aggregations, however, can be costly, both in terms of processing time and in terms of disk space consumed.

Many OLAP data stores contain read only data stored as records of a fixed size on write once, read many media such as CD-ROM and DVD, which are well suited to storing the records in a compressed format. Additionally, since compressed data is typically loaded into memory from a secondary storage device (such as a CD-ROM) faster than the equivalent uncompressed data (fewer bits to move) and decompressing methods are performed in memory, accessing and decompressing a compressed record from a secondary storage device can be significantly faster than accessing the equivalent uncompressed record. Also, a compression method of read only data can employ known characteristics of the floating point values to clean any noise created by its storage in a computer. Thus, a compression/decompression method for read only records of a fixed size in an OLAP data store can provide many benefits besides a reduction in the physical size of the stored data.

It is with respect to these considerations and others that the present invention has been made.

SUMMARY OF THE INVENTION

In accordance with one preferred aspect, the present invention relates to a method of compressing data in a plurality of records in a data store. The plurality of records are divided into at least one segment that includes a predetermined number of records that are arranged in a table. Each row represents a separate record and each column represents a particular field in each record. For each column that has floating point data, the floating point data is converted into integer data for each field in the column. The column width is set equal to zero bits for each column that has the same data repeated in each field. Also, for each column having integer data in the field associated with each record, the column width is set equal to the minimum number of bits necessary to represent the largest integer value in the column. Further, a header is included with the segment that indicates the predetermined number of records, the width of each column in the segment, the precision of each conversion from floating point data to integer data, the repeated data, and the original width for each column. When a record is accessed in a compressed segment, the header information is employed to decompress the width of the columns and restore the original data in each field of the accessed record.

In accordance with still other aspects of the invention, each record includes read only data and each record has a fixed size. Also, the type of data associated with each column in the table is determined.

In accordance with yet other aspects of the invention, an exponent of a conversion mechanism is iteratively incremented to determine the minimum precision necessary to convert a particular floating point value into an integer value. The iteration begins with the exponent representing a minimum value for a type of number represented in a computer and ends with the maximum value of this type of number. The number type includes floating point and real.

In accordance with preferred aspects, the present invention relates to a system for compressing and decompressing a plurality of records. A processor is in communication with a device for a computer readable medium. An operating environment executes on the processor from the computer-readable medium in a data store. An OLAP server executes under the control of the operating environment and performs substantially the same actions of the method discussed above.

The invention may be implemented as a computer process, a computing system or as an article of manufacture such as computer readable media or a computer program product. The computer program product may be a computer storage medium readable by a computer system and encoding a computer program of instructions for executing a computer process. The computer program product may also be a propagated signal on a carrier readable by a computing system and encoding a computer program of instructions for executing a computer process. A more complete appreciation of the present invention and its improvements can be obtained by reference to the accompanying drawings, which are briefly summarized below, to the following detail description of presently preferred embodiments of the invention, and to the appended claims.

BRIEF DESCRIPTION OF THE DRAWINGS

FIG. 6 is an overview of a segment of compressed records;

FIG. 7 is an overview of a segment of compressed records;

FIG. 8 shows two equations for converting floating point data into integer data;

DETAILED DESCRIPTION OF THE PREFERRED EMBODIMENT

In the following detailed description of exemplary embodiments of the invention, reference is made to the accompanying drawings, which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Exemplary embodiments of the invention provide for compressing and decompressing data in read only records that can be represented as tabular data and which have a fixed size. The read only records are divided into separate segments of a determined size that can vary between each segment, e.g., 64 thousand records is a typical size for a segment. For each column of floating point data in a segment, each field in the column is iteratively processed to determine the minimum number of bits for maximum compression. Also, for a column of integer data, each field in the column is analyzed to determine the minimum number of bits necessary to represent the largest integer value. The detailed description is divided into five sections. In the first section, the hardware and the operating environment in conjunction with which embodiments of the invention may be practiced are described. In the second section, an exemplary cube for an OLAP system is described. In the third section, a system level overview of an exemplary embodiment of the invention is presented. In the fourth section, operations performed by an exemplary embodiment of the invention are described. Finally, in the fifth section, a conclusion of the detailed description is provided.

Hardware and Operating Environment

Figure 1:
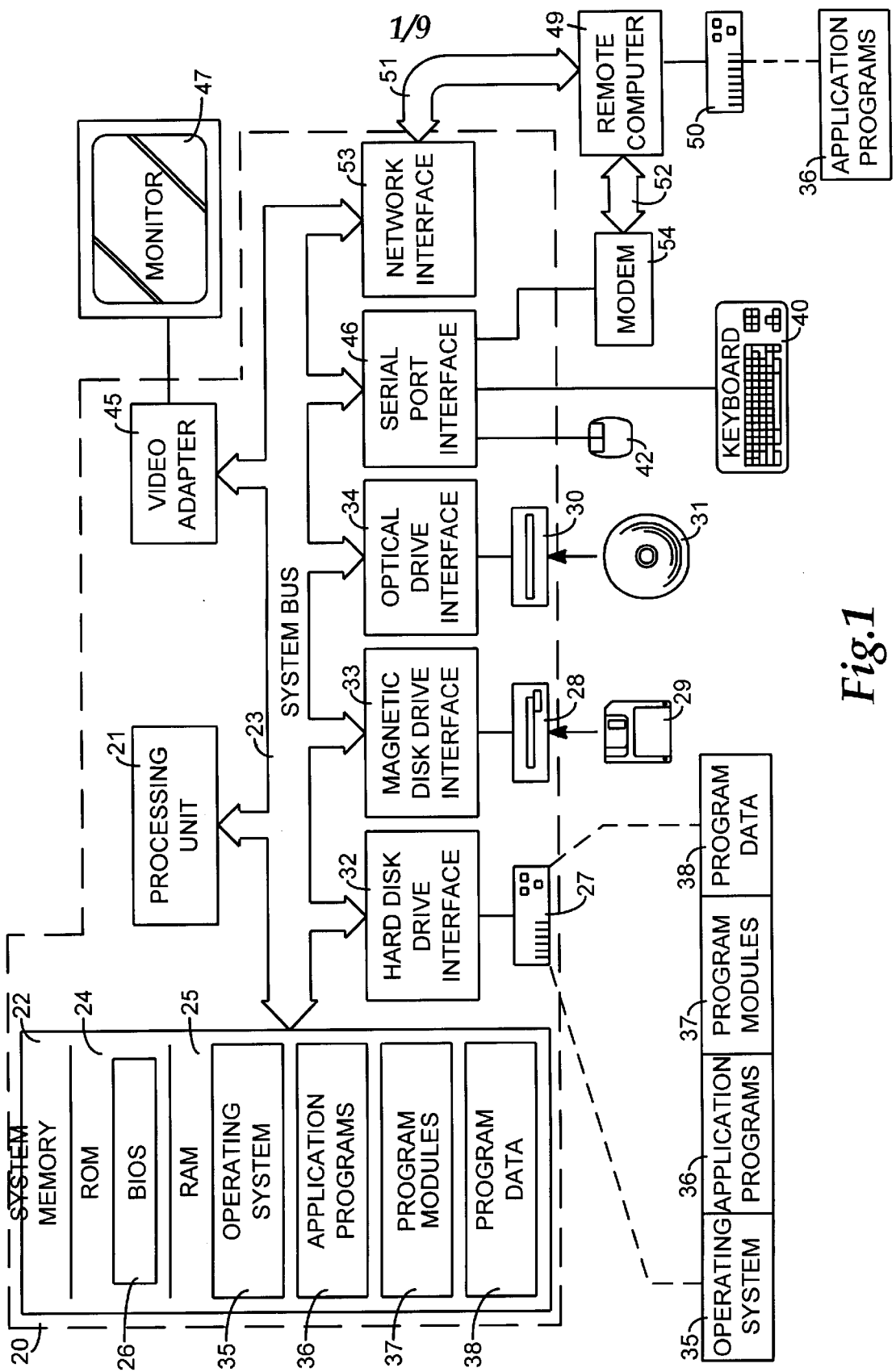
FIG. 1 is a diagram illustrating a hardware and operating environment in conjunction with which embodiments of the invention may be practiced.

FIG. 1 is a diagram of the hardware and operating environment in conjunction with which embodiments of the invention may be practiced. The description of FIG. 1 is intended to provide a brief, general description of suitable computer hardware and a suitable computing environment in conjunction with which the invention may be implemented. Although not required, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including hand-held devices, multiprocessor systems, microprocessor-based or programmable consumer electronics, network PCS, minicomputers, mainframe computers, and the like. The invention may also be practiced in distributed computing environments where tasks are performed by remote processing devices that are linked through a communications network. In a distributed computing environment, program modules may be located in both local and remote memory storage devices.

The exemplary hardware and operating environment of FIG. 1 for implementing the invention includes a general purpose computing device in the form of a computer 20, including a processing unit 21, a system memory 22, and a system bus 23 that operatively couples various system components including the system memory to the processing unit 21. There may be only one or there may be more than one processing unit 21, such that the processor of computer 20 comprises a single central-processing unit (CPU), or a plurality of processing units, commonly referred to as a parallel processing environment. The computer 20 may be a conventional computer, a distributed computer, or any other type of computer; the invention is not so limited.

The system bus 23 may be any of several types of bus structures including a memory bus or memory controller, a peripheral bus, and a local bus using any of a variety of bus architectures. The system memory may also be referred to as simply the memory, and includes read only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated computer-readable media provide nonvolatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 29, optical disk 31, ROM 24, or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. These logical connections are achieved by a communication device coupled to or a part of the computer 20; the invention is not limited to a particular type of communications device. The remote computer 49 may be another computer, a server, a router, a network PC, a client, a peer device or other common network node, and typically includes many or all of the elements described above relative to the computer 20, although only a memory storage device 50 has been illustrated in FIG. 1. The logical connections depicted in FIG. 1 include a local-area network (LAN) 51 and a wide-area network (WAN) 52. Such networking environments are commonplace in offices, enterprise-wide computer networks, intranets and the Internet.

When used in a LAN-networking environment, the computer 20 is connected to the local network 51 through a network interface or adapter 53, which is one type of communications device. When used in a WAN-networking environment, the computer 20 typically includes a modem 54, a type of communications device, or any other type of communications device for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It is appreciated that the network connections shown are exemplary and other means of and communications devices for establishing a communications link between the computers may be used.

The hardware and operating environment in conjunction with which embodiments of the invention may be practiced has been described. The computer in conjunction with which embodiments of the invention may be practiced may be a conventional computer, a distributed computer, or any other type of computer; the invention is not so limited. Such a computer typically includes one or more processing units as its processor, and a computer-readable medium such as a memory. The computer may also include a communications device such as a network adapter or a modem, so that it is able to communicatively couple other computers.

Computing device, such as personal computer 20, typically includes at least some form of computer readable media. Computer readable media can be any available media that can be accessed by personal computer 20. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by personal computer 20. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media. Computer readable media may also be referred to as computer program product.

Exemplary Cube and Dimension

Figure 2:
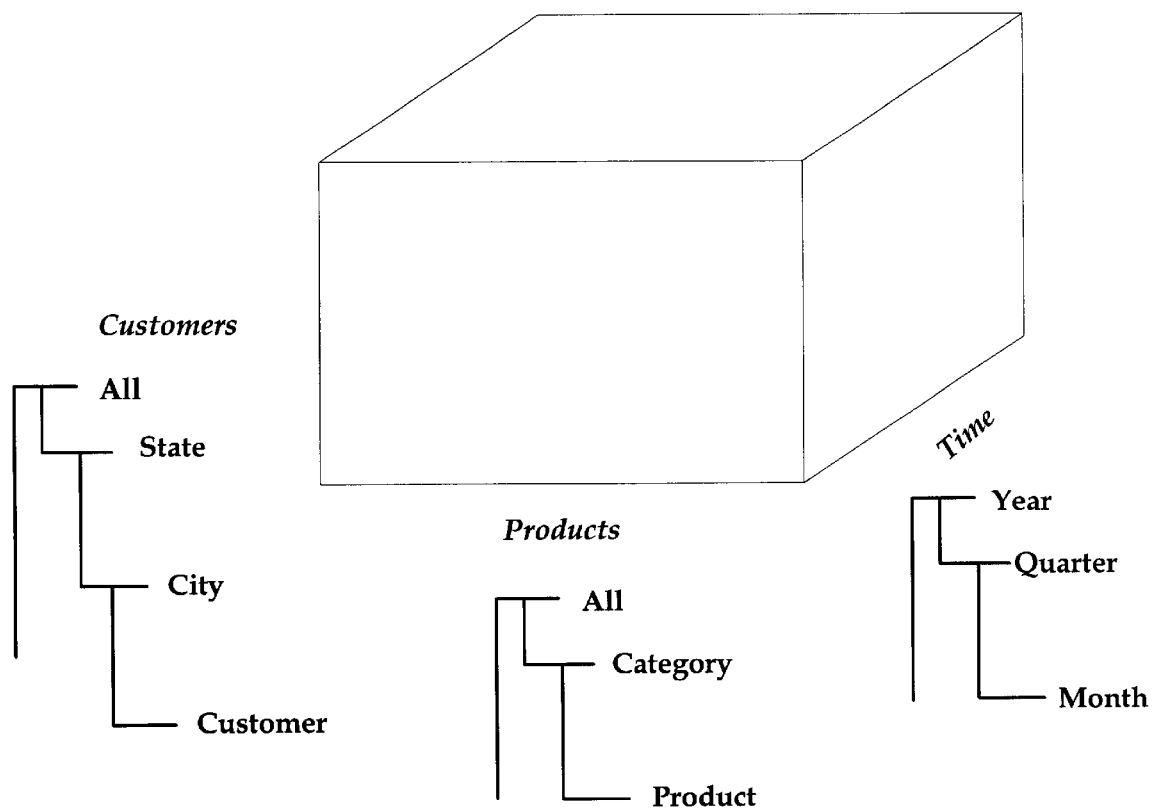
FIG. 2 is a diagram illustrating an exemplary OLAP cube having three dimensions.

In the detailed description that follows, reference will be made to a small, three-dimensional OLAP cube as shown in FIG. 2. This exemplary OLAP cube has three dimensions. The first dimension, the Customers dimension, has four hierarchical levels (All, State, City, and Customer). The second dimension, the Products dimension, has three levels (All, Category and Product). Finally, the third dimension, the Time dimension has three levels (Year, Quarter, and Month). Additionally, the cube has two measures, Purchases and Units (not shown). This cube is presented to provide a reference example of how the systems and methods of the invention operate. It will be appreciated that the OLAP cubes maintained by various embodiments of the invention may have more or fewer dimensions than in this example, and that the OLAP cube may have more or fewer hierarchy levels than in this exemplary example. Also, the OLAP cube may be represented in a tabular format for each level of the third dimension.

Figure 3A:
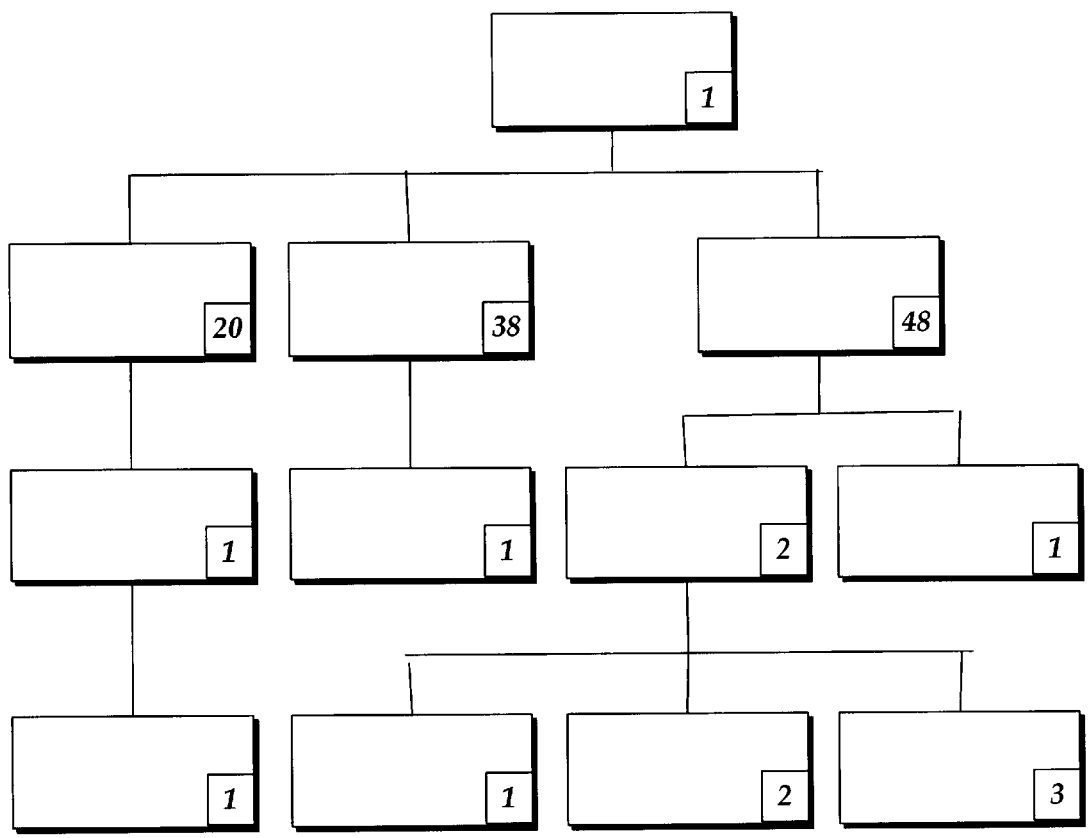
FIGS. 3A–3C are diagrams illustrating an exemplary dimension hierarchy within a multidimensional database.
Figure 3B:
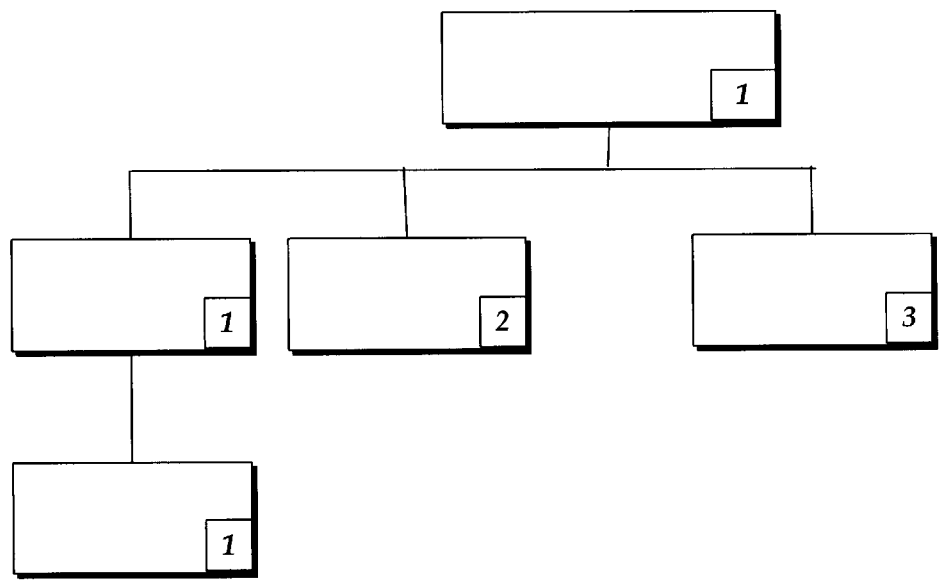
Figure 3C:
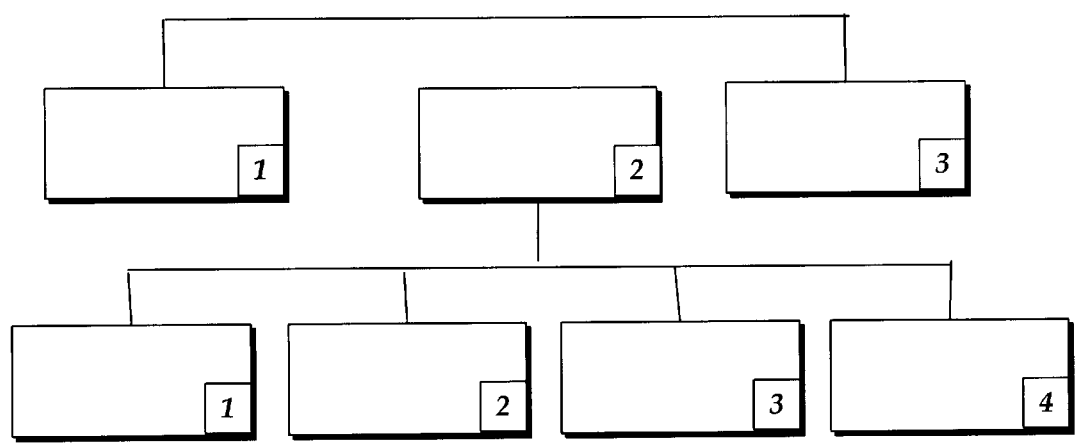

Graphical representations of the dimensions in the above-described exemplary cube are presented in FIGS. 3A–3C. A dimension is represented as a tree, referred to as a dimension tree. Leaf nodes in the tree correspond to the most detailed data in the dimension, while the inner branch nodes correspond to more aggregated data. The closer the node is to the root node, the more aggregated the data, with the root node representing the most aggregated, least detailed data in the dimension.

The Customer dimension is represented in FIG. 3A. In this exemplary representation, the State level has three members: Maine (ME), Oregon (OR) and Washington (WA). The Cities level has four members: Portland (ME), Portland (OR), Redmond and Seattle. It should be noted although a member labeled Portland appears twice, each member is a distinct reference because it appears under a different State member in the hierarchy. The Customer level has four members: Sasha, Alexander, Amir, and Mosha.

The Products dimension is represented in FIG. 3B. In the exemplary representation, the Category level has three members: Food, Drink, and Non-Consumable. The Product level has one member, Milk.

The Time dimension is represented in FIG. 3C. In the exemplary representation, the Year level has three members: 1997, 1998, and 1999. The Quarter level has four members: Q1–Q4. The Month level has no members, indicating that no monthly data is available. In this case, the most detailed data available is at the Quarter level.

Each data cell in a multidimensional database is uniquely identified by specifying a coordinate on each dimension. In one embodiment of the invention, a cell is identified by specifying a dimension path for each dimension in a cube in the multidimensional database. The collection of dimension paths comprising the coordinates for the cell are concatenated and stored in an array referred to as the system path. In an embodiment of the invention, the order of dimension paths in the system path is dependent on the internal order of the dimensions in the cube, as determined by the metadata defining the cube. However, the invention is not limited to a particular ordering scheme and other ordering schemes are possible and within the scope of the invention. For example, the order of dimension paths could be determined alphabetically by the name of the dimension.

In order to uniquely identify a particular member, each of the members from the root node to the leaf node for the member is specified. For example, in an embodiment of the invention, in order to refer to the customer Amir in the Customers dimension shown in FIG. 3A the following sequence of members is specified: {All Customers}.{WA}.{Redmond}.{Amir}. Similarly, to refer to Quarter 2 in the Time dimension shown in FIG. 3C, the members specified are: {1998}.{Q2}.

Those of ordinary skill in the art will appreciate that the members shown in FIGS. 3A–3C represent an exemplary cube and that no embodiment of the invention is limited to a particular number or type of dimensions or dimension members.

In the above example, strings representing member names are used to designate a particular member of a dimension. Alternatively, the strings are replaced with representative members numbers. When represented by numbers, a path from the root node to a branch node is represented by a member number at each level of the dimension that is traversed to reach the leaf node. The number assigned to each member is unique among the members having a common parent. In other words, a unique number is assigned to each of the siblings of a parent. In one embodiment, the root node is assigned the number 1 while branch and leaf nodes are assigned a number representing their order among their siblings. The invention, however, is not limited to any particular numbering scheme for the node. It is sufficient that the number is unique among the nodes having a common parent.

Thus, each member in a dimension is represented by an array of numbers defining the path to the member. This array is the dimension path. The number of elements in the array is the number of levels in the dimension, and the position in the array reflects the hierarchy of levels. For example, referring to FIG. 3A, the dimension path for member Amir in the Customers dimension is {1-48-2-2}. This represents the path comprising the root node All Customers (1), the WA member at the state level (WA is the $48^{th}$ state alphabetically), the Redmond member at the city level (Redmond is the second city at that level under WA), and the member Amir at the customer level (Amir is the second customer under Redmond). In one embodiment, a number in the array represents each level. If the member is not at a leaf node, the number 0 is used in one embodiment of the invention to represent the positions for the levels below the member. Thus, the dimension path array for the member Portland, OR in the Customer dimension is {1-38-1-0}.

Not all dimensions have a single root member. For example, consider the Time dimension of the exemplary cube. There is no single "all time" member at the top-most level in this dimension, rather the Time dimension contains three members, each specifying a particular year. In this case, one embodiment of the invention assigns an index number to each members in the top-most level based on a natural order of the members. This natural order can be based on a numeric order, an alphabetic order, or the temporal order in which the members were created. For instance, in FIG. 3C, the dimension path for Q3 in the year 1998 is {2-3-0} (1998 is the second year at the top-most level, Q3 is the third member under 1998, and there are no month members).

The dimension paths described above are referred to as rigid dimension paths, because they do not allow a cell to change its position within the dimension hierarchy without having to rebuild the database. This is because the indexing scheme used directly maps to a particular point in the hierarchy, and cannot map to any other point without changing at least one of the index components.

Flexible dimension paths offer an alternative to rigid dimension paths. Flexible dimension paths allow a cell to change its position in the hierarchy without affecting the stored path. In order to implement flexible paths, a system maintains a mapping from a rigid dimensional path to an identifier associated with a cell member. For example, the table below illustrates a mapping for the Customer dimension members provided above.

TABLE 1

| Customer | Id | Rigid Dimension Path |
|---|---|---|
| Alexander | &14 | {1-48-2-1} |
| Amir | &15 | {1-48-2-2} |
| Mosha | &16 | {1-48-2-3} |
| Sasha | &17 | {1-20-1-1} |

To illustrate the system path described above, consider the cell associated with the customer Amir for All Products in Quarter 4 of 1998. The string representation for the cell path is: ({Customers}.{All_Customers}.{WA}.{Redmond}. {Amir}, {Products}.{All Products}, {Time}.{1998}.{Q4}). The corresponding system path using numbered rigid dimensional paths is: {1-48-2-2}-{1-0-0}-{2-4-0}. system path can be represented using a flexible dimension path as {&15}-{1-0-0}-{2-4-0}. In this case, when the cell is accessed, the accessor consults a mapping table to determine the correct cell location for the dimension represented by the flexible portion of the path. In the example above, only one dimension has a flexible path. The invention is not so limited, however, and the number of flexible paths appearing in a system path is not fixed to any particular number. It is desirable to differentiate the flexible path from a rigid path containing only one level, thus a flexible path is introduced by a distinguishing character. In one embodiment of the invention, the distinguishing character is the "&", however the invention is not limited to any particular distinguishing character or set of characters. Now assume that Amir moves from Redmond to Seattle. In this case, the rigid dimensional path changes from {1-48-2-2} to {1-48-1-1}. However, the flexible dimension path remains the same (&15). Thus, as can be seen from the above example, the database does not need to be rebuilt when a member moves from one point in the hierarchy to another, because the system path to the cell does not change. The change is to the mapping in a map table, not the path in a local store.

In another embodiment of the invention, the numbered rigid dimensional path and flexible dimension path are compressed. In one particular embodiment, each member number in the system path is represented by the least number of bits to store the largest member number at that particular level.

In addition to a system path, each cell in a multidimensional database has one or more measures associated with it. In the exemplary cube, two measures are defined, Purchases and Units, where Purchases is the dollar amount of a particular purchase, and Units is the number of units purchased. In one embodiment of the invention the integer data in the measures is compressed in binary format. The data are compressed in such a way as to maintain random access to the data, thereby decreasing access time to the data.

Figure 4:
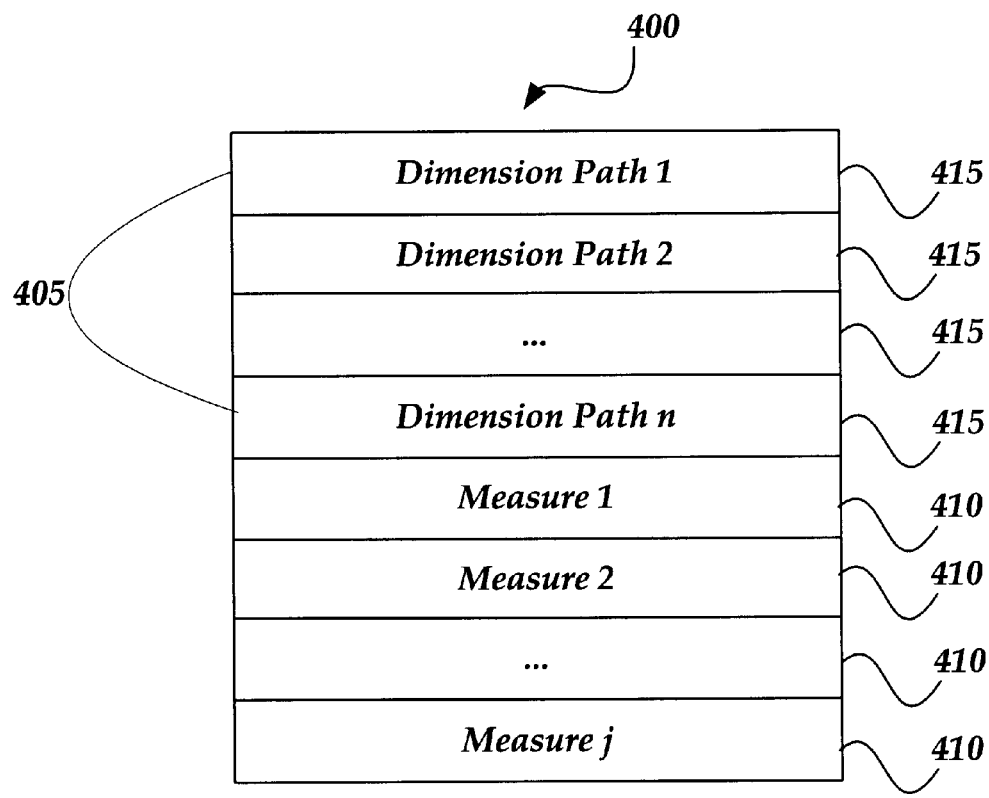
FIG. 4 is a diagram illustrating a record structure for a cell data record according to an embodiment of the invention.

FIG. 4 illustrates a data structure for a cell record 400 according to one embodiment of the invention. Cell record 400 contains a system path 405 and one or more compressed measures 410. As described above, system path 405 comprises one or more dimension paths 415. The dimension paths can be either flexible dimension paths or rigid dimension paths, compressed or uncompressed. The order of measures 410 in record 400 may be determined by the order of the measures in the metadata defining the cube, the temporal order in which the measure were defined, or an alphabetic order. The invention is not limited to any particular ordering mechanism.

This section of the detailed description has described a representation of cells in a multidimensional database, and a data structure for storing a cell record. In the sections that follow, systems and methods for creating, manipulating, compressing and decompressing the cell data will be described.

System Level Overview

Figure 5:
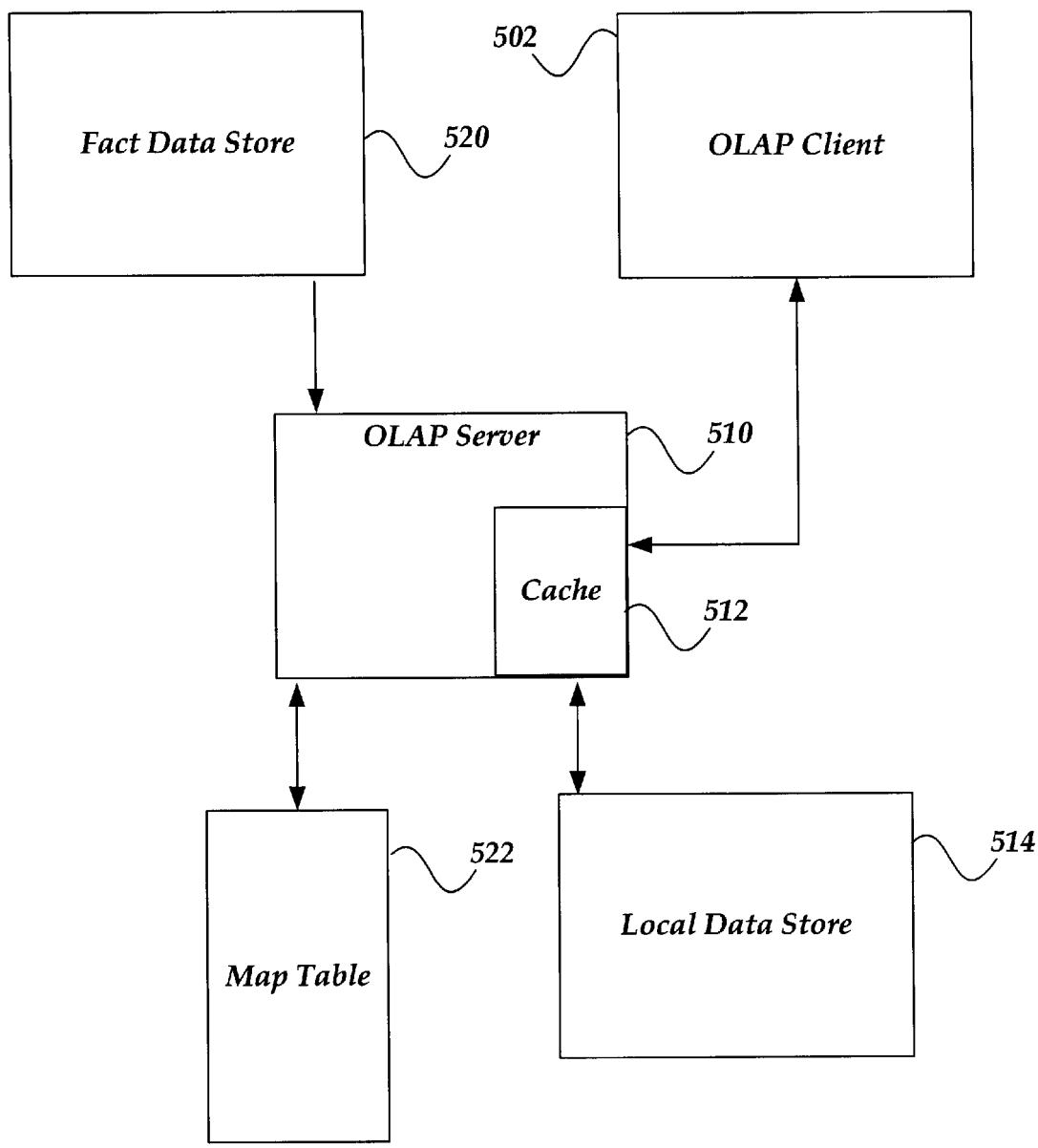
FIG. 5 is a system level overview of various embodiments of the invention.

A system level overview of the operation of an exemplary embodiment of the invention is described by reference to FIG. 5. The concepts of the invention are described as operating in a multiprocessing, multithreaded virtual memory operating environment on a computer, such as computer 20 in FIG. 1. The operating environment includes an OLAP client 502, OLAP server 510, local data store 514, and fact data store 520, all of which operate on the cell records for cubes, including the records and cube described in the previous section.

OLAP client 502 is an application program that requires the services of an OLAP system. OLAP client 502 may be any type of application that interacts with the OLAP system, for example, a data mining application, a data warehousing application, a reporting application, etc. OLAP client 502 typically interacts with OLAP server 510 by issuing OLAP queries. These queries are parsed, as is known in the art, into a request for data from a cell or range of cells, and the request is passed to the OLAP server 510.

OLAP server 510 receives queries and controls the processing of queries. In one embodiment of the invention, the server maintains a local store 514 that contains the cell data used to answer the queries. In an embodiment of the invention, the OLAP server 510 is a version of the SQL Server OLAP product from Microsoft Corporation.

The local data store 514 contains records describing the cells that are present in a multidimensional database, with one record used for each cell that actually has measurement data present (i.e. no records exist for those cells having no measurement data). The general format of these records is described above with reference to FIG. 4. In an embodiment of the invention, local data store 514 is a relational database, such as SQL Server. In this particular embodiment, records are stored in a relational table. This table can be indexed based on the dimensional paths of the record to allow rapid access to cell measurement data contained in the record. The indexing can be performed using hash indexing or AVL tree indexing as is known in the art.

OLAP server 510 populates local data store 514 by reading data from fact data store 520. Fact data store 520 is also a relational database system. In one embodiment of the invention, the system used is the SQL Server Database from Microsoft Corporation. In alternative embodiments of the invention, database systems such as Oracle, Informix or Sybase can be used. The invention is not limited to any particular type of relational database system.

OLAP server 510 reads the fact data (also known as detail data) from fact data store 520 at predetermined times, and converts the fact data into cell data records for populating local data store 514. In an embodiment of the invention, the fact data is read once during a 24 hour period, typically during a time when the fact data store is not busy responding to user queries. In an alternative embodiment of the invention, the fact data is read and converted when a system administrator issues a command to the OLAP server 510 to do so. Updates to the local data store 514 can be incremental, or they can result in a complete refresh of the data. Incremental updates are desirable, because only the data that has changed in fact data store 520 need be converted and added to local data store 514. However, if the structure of the data in either fact data store 520 or local data store 514 changes, then a complete refresh is required. The frequency of updates to the local data store 514 will generally be determined by user requirements as to how current (or accurate) the cell data must be, and the volume of data that must be updated.

OLAP server 510 also maintains a map table 522. The map table 522 is used to maintain mappings from rigid dimensional paths to unique member identifiers. The OLAP server 510 uses the map table to determine whether or not a flexible path can be constructed when a new cell record is added to local data store 514.

In an embodiment of the invention, the OLAP server 510 maintains a cache 512 of cell records. In this embodiment, the cache 512 maintains cell data records that have been recently requested, or those cell data records that are frequently requested. Maintaining cell record data in a cache is desirable, because it provides quicker responses to queries that can be satisfied by records appearing in the cache.

Operations In an Exemplary Embodiment of the Invention

As mentioned at the beginning of this Detailed Description, exemplary embodiments of the invention provide for compressing and decompressing data in read only records that can be represented as tabular data and which have a fixed size. Each row represents a separate record and each column represents a particular field in each record. The read only records are divided into separate segments of a determined size that can vary between each segment, e.g., 64 thousand records is a typical size for a segment. For each column of floating point data in a segment, each field in the column is iteratively processed to determine the minimum number of bits for conversion to integer data with the minimum precision necessary for subsequent reconversion into the original floating point data. Also, for a column of integer data, each field in the column is analyzed to determine the minimum number of bits necessary to represent the largest integer value.

FIG. 6 illustrates an exemplary embodiment of an uncompressed segment of N read only records 600 represented as tabular data. Each column of the segment 600 has a type of data (integer or floating point) that is associated with the fields in the particular column. For example, the identifier column includes separate fields of integer data and the price column includes fields of floating point data. Also, the number of bytes employed to store data in a field for each column is indicated across the top of the tabular representation of the uncompressed segment 600. As indicated, a total of 15 bytes (120 bits) are employed to represent each field in each record in the uncompressed segment 600, i.e., the identifier field is four bytes, quantity field is four bytes, price field is four bytes, store field is two bytes and state field is one byte.

FIG. 7 shows an exemplary embodiment of N read only records in a compressed segment 602 that also represents the same data included in the uncompressed segment 600. In the compressed segment 602, only three bytes (24 bits) are necessary to represent the same columns of tabular data that require 15 bytes to represent in the uncompressed segment 600. The floating point data in the fields of the price column have been converted to integer data that can be represented in 10 bits and each column with fields of repeating values are set equal to zero bits, i.e., the store field and the state field. Also, the width of each column with fields of integer data are converted to the minimum number of bits necessary to represent the largest integer value in the particular column, i.e., the identifier column width is set equal to 10 bits and the quantity column width is set equal to 4 bits.

FIG. 8 illustrates equation number one for iteratively determining the precision necessary to compress the floating point data in each column. Equation number one is employed to iteratively convert each floating point value into a rounded up integer value with the minimum amount of necessary precision to reconstitute the floating point value. Equation number two is employed to reconvert the rounded up integer value into the original floating point value. Also, equation number two is employed to iteratively check the precision of the rounded up integer value created by equation number one. Once the minimum precision is determined for converting a particular floating point value into an integer value that can be reconverted back into the original floating point value, equation number one is employed to convert the floating point value into a "final" integer value.

For both equations, the "V" variable represents the original floating point value in a particular column/field of a particular record and "n" represents the level of precision necessary to reconstitute the original floating point value from a converted integer value. Also, the constant (0.5) is employed to round up the result in equation number one calculations and this constant is multiplied by the sign of the floating point value.

In the previous section, a system level overview of the operation of an exemplary embodiment of the invention was described. In this section, the particular logical operations of the invention performed by an operating environment executing an exemplary embodiment are described by reference to a series of flowcharts shown in FIGS. 9 and 10. The operations to be performed by the operating environment constitute computer programs made up of computer-executable instructions. The logical operations of the various embodiments of the present invention are implemented (1) as a sequence of computer implemented steps or program modules running on a computing system and/or (2) as interconnected hardware or logic modules within the computing system. The implementation is a matter of choice dependent on the performance requirements of the computing system implementing the invention. Accordingly, the logical operations making up the embodiments of the present invention described herein may be referred to alternatively as operations, steps, acts or modules.

Describing the operations by reference to a flowchart enables one skilled in the art to develop such programs including such instructions to carry out the operations on suitable computers (the processor of the computer executing the instructions from computer-readable media). Also, the operations illustrated in FIGS. 9 and 10 are inclusive of the acts to be taken by an operating environment executing an exemplary embodiment of the invention.

Figure 9:
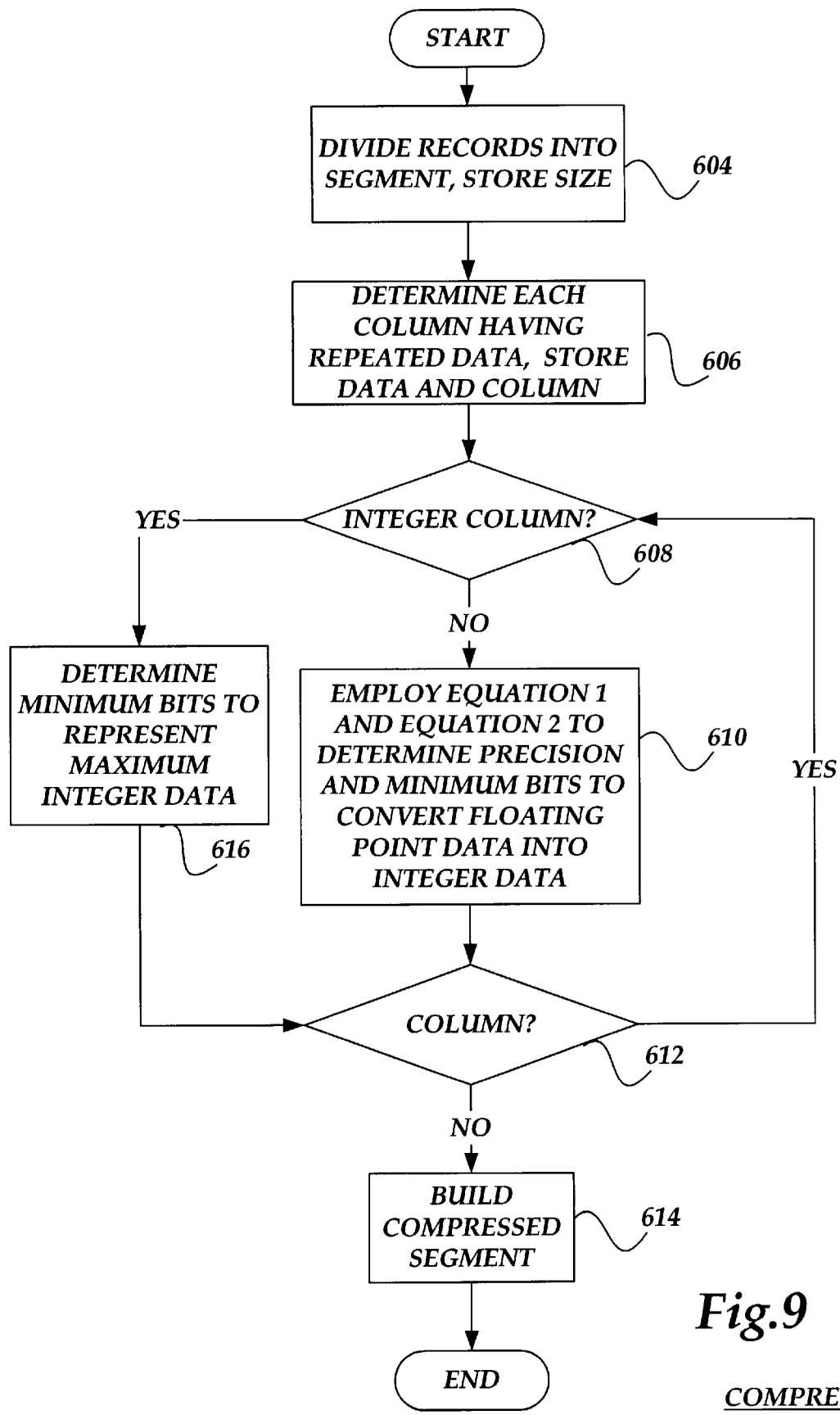
FIG. 9 is a flowchart illustrating the compression of a plurality of records.
Figure 10:
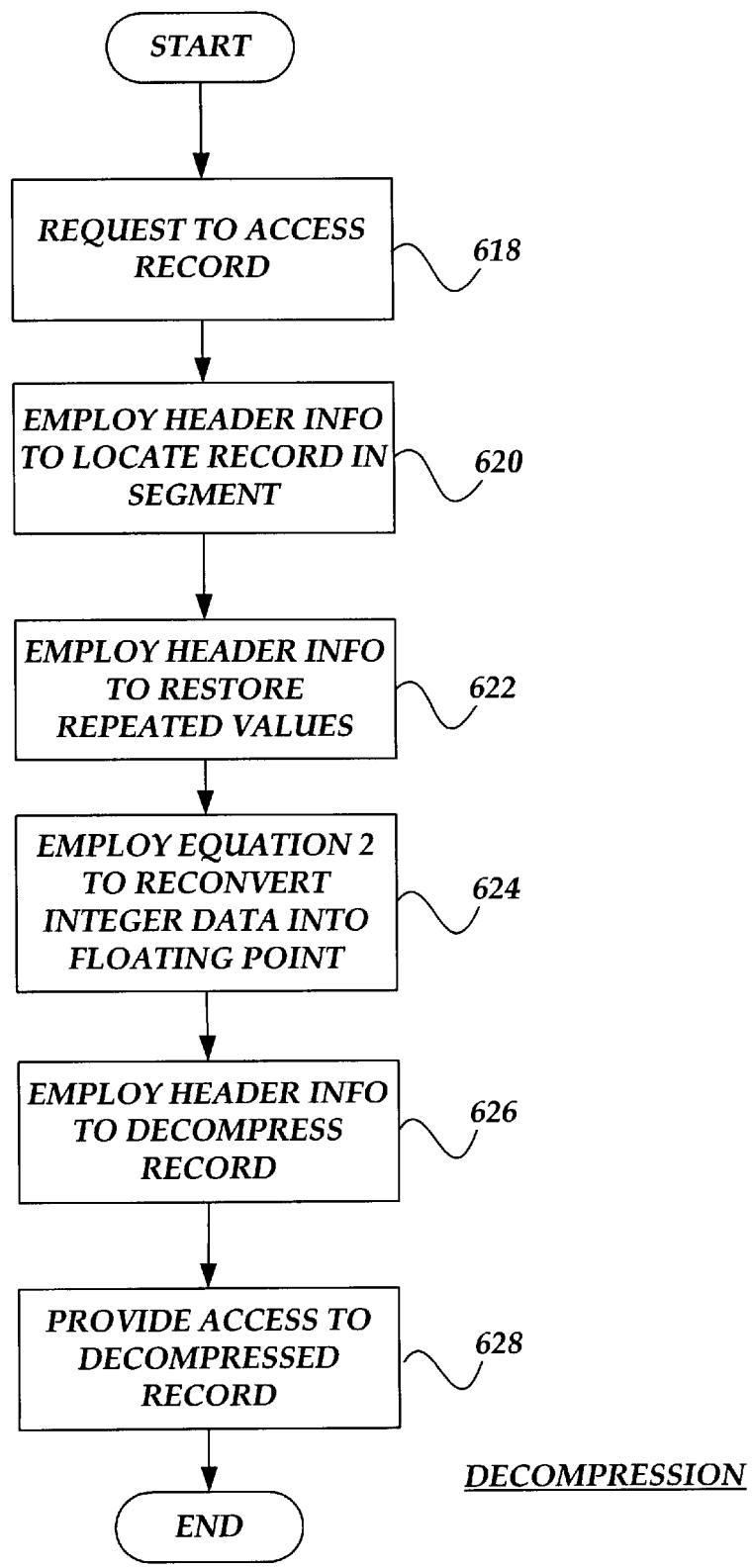
FIG. 10 is a flowchart illustrating the decompression of previously compressed records in an embodiment of the invention.

An operational flow for compressing read only records is illustrated in FIG. 9. The operational flow advances to a segment operation 604 where the records in a data store are divided into a series of segments of a predetermined size, which can vary from segment to segment depending on the type of data and how many records are available for dividing into a segment such as the last segment. In this exemplary embodiment, the records are divided up into segments containing 64,000 records and this size is stored in a header for the segment. Repetitive value operation 606 identifies in the segment each column of fields that include a continuously repeating value, either integer or floating point. Operation 606 stores the location of the column of fields that have a continuously repeating value in the header for the segment along with the repeated value. Significantly, since each column represents the same field in each record, all of the fields in the column will be the same type, i.e., integer or floating point.

Test operation 608 detects whether a column of fields of non-repeating data contain integer values. If YES, the logic flow moves to a size operation 616, which determines the minimum number of bits to represent the largest integer value in the column. When test operation 608 detects a column does not contain integer data, the operational flow transitions to a precision module 610. In module 610 equation number one is iteratively applied to the first floating point value in the non-integer column as discussed in greater detail above and below.

A common range of values to represent a floating point number in a computer ranges from 10 to the power of a −38 exponent to 10 to the power of a +38 exponent. Similarly, for a real number stored in a computer, the range extends from 10 to the power of a −308 exponent to 10 to the power of a +308 exponent.

When the first floating point value for a column is processed, the operational flow starts with the "n" precision exponent of equation number one set equal to −38 and the result "L" of equation number one (as shown in FIG. 8) is calculated. The precision of the result of equation number one is checked by determining if equation number two (as shown in FIG. 8) is true/equal. If not, the "n" precision exponent for the floating point value in the column is incremented and equation number one is recalculated by module 610 until equation number two is found to be true. This process is repeated with the determined minimum "n" precision exponent for all of the other floating point values in the column. The minimum "n" precision exponent for the column is determined by this iterative process and associated with the particular column in the header of the segment.

Once the "n" precision exponent is calculated for each floating point value in a column, each floating point value is converted by module 610 into an integer value with equation number one (as shown in FIG. 8) by dividing each original floating point value by 10 to the power of the minimum "n" precision exponent and adding the constant (0.5) that is also multiplied by the sign of the converted floating point value. Also, the largest converted integer value is employed by module 610 to define the minimum number of bits required to represent the original floating point value in the "compressed" column.

After the size operation 616 or the precision module operations 610, the operational flow moves to a decision operation 612, which determines whether another column in the segment still needs to be processed. If true or YES, the operational flow loops back to the test operation 608 and repeats substantially the same actions discussed above.

When the determination at the decision operation 612 is false or NO, the operational flow moves to a compression operation 614. Compression module 614 builds the compressed segment by storing references to sizes, precision exponents and continuously repeated columns and values into a header (not shown) of the segment. All columns with continuously repeating data are set equal to zero bits and each column of integer data and converted integer data are set equal to the minimum determined number of bits necessary for their largest value. Next, the operational flow resumes calling other program modules. Also, substantially the same operational flow discussed above is repeated for each segment of records.

Additionally, since particular information is often known about a particular column of fields, this information may be employed by compression module 614 to clean the original floating point data during compression, i.e., conversion to integer data. For example, when floating point data in a field is known to be associated with dollars, the first two numbers to the right of the decimal point are known to represent cents and any noise (numbers) in the original floating point number that occurs after these two decimal places is cleaned, i.e., not included in the conversion to integer data.

An operational flow for decompressing a segment of compressed records is illustrated in FIG. 10 and starts with receive operation 618. Receive operation 618 receives a request to access a compressed record. Find operation 620 locates the requested record from the information in the header for the segment such as the segment size. Restore operation 622 employs the information in the segment header to decompress the values for fields (columns) in the requested record that were continuously repeated in the segment.

Reconvert operation 624 employs equation number two and the minimum "n" precision exponent associated with the column and stored in the segment header are employed to reconvert any previously converted integer value into the original floating point value for the requested record. Decompression module 626 decompresses or reconstitutes the complete compressed record into the original uncompressed record based on the information stored in the header for the segment. Access operation 628 retrieves each field in the decompressed record. Next, the operational flow returns to calling other program modules.

Additionally, it is envisioned that an individual field in a record could be separately decompressed without having to decompress any other field in the record.

Since many embodiments of the invention can be made without departing from the spirit and scope of the invention, the invention resides in the claims hereinafter appended.

We claim:

1. A method for compressing data in a plurality of records in a data store, comprising the actions of:

(a) dividing the plurality of records into at least one segment, each segment including a predetermined number of records that are arranged in a table, each row of the table representing a separate record and each column representing a particular field in each record;

(b) for each column having floating point data associated with each field, converting the floating point data into integer data for each field in the column;

(c) for each column having the same data repeated in each field, setting the width for the column having repeated data equal to zero bits;

(d) for each column having integer data in the each field, setting the width for each column equal to the minimum number of bits necessary to represent the largest integer value in the column; and (e) including a header with the segment that indicates the predetermined number of records in the segment, the width of each column in the segment, the precision of the conversion from floating point data to integer data for each column having converted data, the repeated data for each column having a width set to zero bits, and the original width for each column such that the header of the segment can be employed to decompress the width of the columns and restore the original data in each field of a record that is accessed.

2. The method of claim 1, wherein each record has a fixed size.

3. The method of claim 1, wherein the data included in each record in the segment is read only data.

4. The method of claim 1, further comprising determining a type of data associated with each column in the table, each column being associated with a field in each record.

5. The method of claim 1, further comprising iteratively incrementing an exponent to determine the minimum precision necessary to convert the floating point data to integer data.

6. The method of claim 5, wherein the iteration begins with the exponent representing a minimum value for data represented in a computer.

7. The method of claim 6, wherein the exponent is incremented to a number no greater than the maximum value representable by the computer.

8. The method of claim 7, wherein the minimum value and maximum value represent a floating point number.

9. The method of claim 7, wherein the minimum value and maximum value represent a real number.

10. Apparatus for compressing a plurality of records in a datastore, comprising:
   (a) a load module for loading a plurality of records from the data store and dividing the loaded records into at least one segment, each segment including a predetermined number of records that are arranged in a table, each row representing a separate record and each column representing a particular field in each record;
   (b) a compression module for compressing data in each column of the table of records, the compression module performing actions, including:
      (i) for each column having floating point data associated with each field, converting the floating point data into integer data for each field in the column;
      (ii) for each column having the same data repeated in each field, setting the width for the column having repeated data equal to zero bits;
      (iii) for each column having integer data in each field, setting the width for each column equal to the minimum number of bits necessary to represent the largest integer value in the column; and
      (iv) including a header with the segment that indicates the predetermined number of records in the segment, the width of each column in the segment, the precision of the conversion from floating point data to integer data for each column having converted data, the repeated data for each column having a width set to zero bits, and the original width for each column such that the header of the segment can be employed to decompress the width of the columns and restore the original data in each field of a record that is accessed.

11. A computer-readable medium readable by a computing system and having instructions for executing a process for compressing a plurality of records, the process comprising the actions of:
   (a) dividing a plurality of records into at least one segment, each segment including a predetermined number of records that are disposed in a table, each row representing a separate record and each column representing a particular field in each record;
   (b) for each column having floating point data associated with each field, converting the floating point data into integer data for each field in the column;
   (c) for each column having the same data repeated in each field, setting the width for the column having repeated data equal to zero bits;
   (d) for each column having integer data in each field, setting the width for each column equal to the minimum number of bits necessary to represent the largest integer value in the column; and
   (e) including a header with the segment that indicates the predetermined number of records in the segment, the width of each column in the segment, the precision of the conversion from floating point data to integer data for each column having converted data, the repeated data for each column having a width set to zero bits, and the original width for each column such that the header of the segment can be employed to decompress the width of the columns and restore the original data in each field of a record that is accessed.

12. The computer readable medium of claim 11, wherein each record has a fixed size and the data included in each record in the segment is read only data.

13. The computer readable medium of claim 11, further comprising iteratively incrementing an exponent to determine the minimum precision necessary to convert the floating point data to integer data.

14. The computer readable medium of claim 13, wherein the iteration begins with the exponent representing a minimum value for data represented in a computer.

15. The computer readable medium of claim 13, wherein the exponent is incremented to a number no greater than the maximum value representable by the computer.

16. A system comprising:
   (a) a processor in communication with a device for a computer readable medium;
   (b) an operating environment executing on the processor from the computer-readable medium;
   (c) a data store; and
   (d) an OLAP server executing under the control of the operating environment and performing actions, including:
      (i) dividing a plurality of records into at least one segment, each segment including a predetermined number of records that are arranged in a table, each row representing a separate record and each column representing a particular field in each record;
      (ii) for each column having floating point data associated with each field, converting the floating point data into integer data for each field in the column;
      (iii) for each column having the same data repeated in each field, setting the width for the column having repeated data equal to zero bits;
      (iv) for each column having integer data in each field, setting the width for each column equal to the minimum number of bits necessary to represent the largest integer value in the column; and
      (v) including a header with the segment that indicates the predetermined number of records in the segment, the width of each column in the segment, the precision of the conversion from floating point data to integer data for each column having converted data, the repeated data for each column having a width set to zero bits, and the original width for each column such that the header of the segment can be employed to decompress the width of the columns and restore the original data in each field of a record that is accessed.

17. The system of claim 16, wherein each record has a fixed size and the data included in each record in the segment is read only data.

18. The system of claim 16, further comprising iteratively incrementing an exponent to determine the minimum precision necessary to convert the floating point data to integer data.

19. The system of claim 18, wherein the iteration begins with the exponent representing a minimum value for data represented in a computer.

20. The system of claim 19, wherein the exponent is incremented to a number no greater than the maximum value representable by the computer.

* * * * *